United States Patent
Park et al.

(10) Patent No.: US 7,635,897 B2
(45) Date of Patent: Dec. 22, 2009

(54) DUAL GATE STRUCTURE, FABRICATION METHOD FOR THE SAME, SEMICONDUCTOR DEVICE HAVING THE SAME

(75) Inventors: Heesook Park, Seoul (KR); Jaehwa Park, Gyeonggi-Do (KR); Janghee Lee, Seoul (KR); Geumjung Seong, Yongin (KR); Byunghak Lee, Gyeonggi-Do (KR); Dongchan Lim, Gyeonggi-Do (KR); Taeho Cha, Gyeonggi-Do (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 0 days.

(21) Appl. No.: 11/354,599

(22) Filed: Feb. 14, 2006

(65) Prior Publication Data

US 2007/0034964 A1 Feb. 15, 2007

(30) Foreign Application Priority Data

Aug. 10, 2005 (KR) .................. 10-2005-0073415

(51) Int. Cl.
H01L 23/62 (2006.01)
(52) U.S. Cl. .............................. 257/369; 257/E21.637
(58) Field of Classification Search .......... 257/E21.637, 257/369

See application file for complete search history.

(56) References Cited

U.S. PATENT DOCUMENTS

| | | | | |
|---|---|---|---|---|
| 6,165,858 A | * | 12/2000 | Gardner et al. | 438/305 |
| 6,743,704 B2 | | 6/2004 | Takahashi | |
| 2001/0030342 A1 | * | 10/2001 | Ohnishi et al. | 257/315 |
| 2002/0004263 A1 | * | 1/2002 | Tanabe et al. | 438/199 |
| 2002/0102796 A1 | | 8/2002 | Lee et al. | |
| 2005/0073011 A1 | * | 4/2005 | Taguwa | 257/371 |

OTHER PUBLICATIONS

Fumio Ohtake, Yasushi Akasaka, et al. A Thin Amorphous Silicon Buffer Process for Suppression of W Polymetal Gate Depletion in PMOS' IEEE 2000 Symposium on VLSI Technology Digest of Technical Papers, pp. 74-75.

* cited by examiner

Primary Examiner—Bradley K Smith
Assistant Examiner—Amar Movva
(74) Attorney, Agent, or Firm—F. Chau & Associates, LLC

(57) ABSTRACT

In one embodiment, a semiconductor device includes at least two stacked gate structures formed on a substrate. The two stacked gate structures each include a semiconductor layer and a metal layer over the semiconductor layer. The two stacked gate structures on the substrate are characterized by differential intermediate layers, one of the two structures including an ohmic layer and the other of the two structures not including an ohmic layer.

17 Claims, 6 Drawing Sheets

US 7,635,897 B2

DUAL GATE STRUCTURE, FABRICATION METHOD FOR THE SAME, SEMICONDUCTOR DEVICE HAVING THE SAME

CROSS-REFERENCE TO RELATED APPLICATION

The present application claims the priority of Korean Patent Application No. 2005-73415, filed Aug. 10, 2005 in the Korean Intellectual Property Office. The disclosures of all of the above applications are incorporated herein in their entirety by reference.

BACKGROUND OF INVENTION

1. Field of the Invention

The present invention generally relates to semiconductor fabrication and, more particularly, to a semiconductor device having dual gate structures and formation thereof.

2. Description of Related Art

As semiconductor devices continue to scale down and the speed of the semiconductor devices increases rapidly, signal delay also increases due to high resistance and depletion of dopants in the conventional polysilicon gate electrode. Thus, signal delay reduction has become an important goal in the semiconductor industry.

Along with this trend, poly-metal gates or metal gates are being pursued to further reduce the resistance and in turn to reduce the signal delay in the semiconductor devices. In the case of metal gates, however, gate dielectrics can be contaminated if the metal layer is directly formed thereon. Therefore, the metal layer is normally formed on the doped polysilicon layer to form the gate electrode. It is generally known that if a metal such as tungsten that has a low sheet resistance is used as a gate material, an RC signal delay time is remarkably reduced.

However, there still is a need to overcome the problems of the prior art, e.g., reducing high resistance and poly depletion in the gate electrode.

SUMMARY

In one embodiment, a semiconductor device includes at least two stacked gate structures formed on a substrate. The two stacked gate structures each include a semiconductor layer and a metal layer above the semiconductor layer. The two stacked gate structures on the substrate are characterized by differential intermediate layers, one of the two structures including an ohmic layer and the other of the two structures not including an ohmic layer between the semiconductor layer and the metal layer.

BRIEF DESCRIPTION OF THE DRAWINGS

The aspects and advantages of the present invention will become more apparent with the detailed description of the exemplary embodiments with reference to the attached drawings.

DETAILED DESCRIPTION

Figure 1:
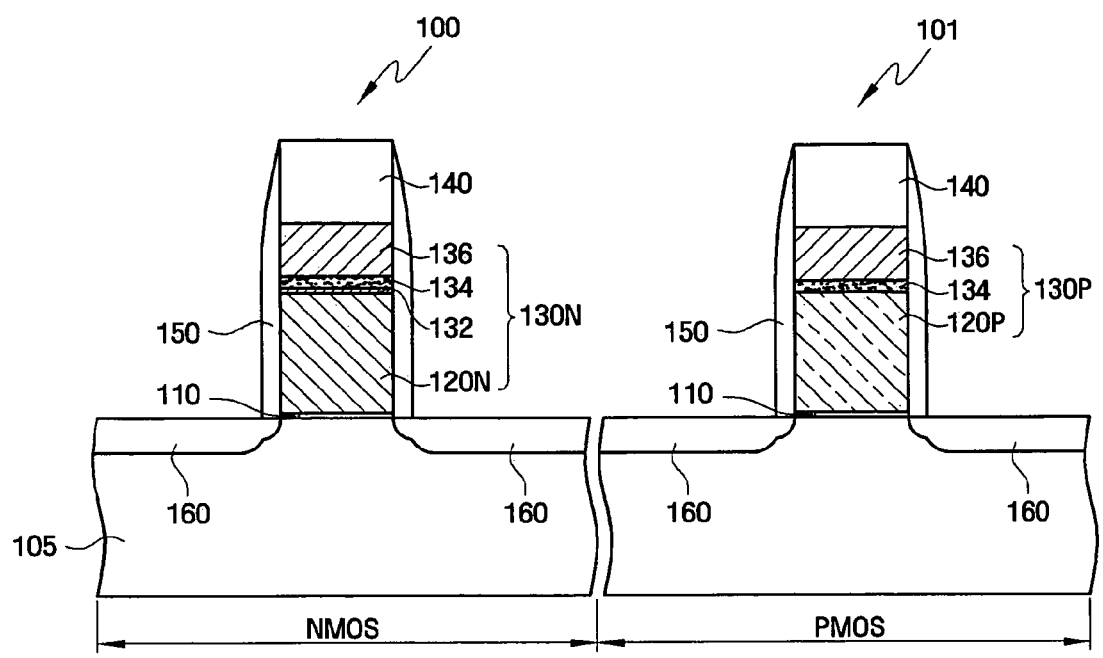
FIG. 1 is a cross-sectional view showing a multilayer structure of a semiconductor device according to one embodiment.

In the following description, several exemplary embodiments of the invention are described. These exemplary embodiments are not intended to be limiting in any way, but rather to convey the inventive aspects contained in the exemplary embodiments to those skilled in this art. Those skilled in this art will recognize that various modifications may be made to the exemplary embodiments without departing from the scope of the invention as defined in the attached claims.

It will be understood that when an element or layer is referred to as being "on", "connected to" or "coupled to" another element or layer, it can be directly on, connected or coupled to the other element or layer or intervening elements or layers may be present.

Like numbers refer to like elements throughout. As used herein, the term "and/or" includes any and all combinations of one or more of the associated listed items.

As discussed above, poly-metal gate structures are now popular gate electrode of choice as they can further reduce the resistance and thereby reduce the signal delay in the semiconductor devices. However, a metal such as tungsten may react with polysilicon at high temperatures to form undesirable compounds, thereby increasing interface resistance therebetween and slowing down the operation speed of the semiconductor device. Thus, a reaction barrier layer can be formed between the metal and polysilicon to prevent or reduce any reaction therebetween, e.g., the reactive formation of a silicide material such as tungsten silicide, by suppressing the mutual inter-diffusion of metal and silicon.

Unfortunately, the interface resistance of such a reaction barrier layer can be very high and this problem has become more notable as the size of the transistor becomes smaller and smaller. Applicant has discovered that, especially in the case of an N-type transistor, (unlike a P-type transistor) the unacceptably high interface resistance may lead to a device malfunction. Therefore, to reduce the contact, or interface, resistance between the polysilicon layer and the reaction barrier layer, an ohmic layer is formed therebetween in the N-type transistor.

On the other hand, in the case of a P-type transistor, if the ohmic layer, e.g., a metal silicide, is formed in the PMOS gate stack, it can act as a diffusion path of dopants, aggravating the so-called "poly depletion" problem. In particular, dopants such as boron (B) undesirably out-diffuse from a polysilicon layer during heat treatment processes such as rapid thermal processing (RTP), leading to unacceptable C-V characteristics. This in turn results in the degradation of the P-type transistor characteristics and the overall performance of the semiconductor devices.

In addition, the device performance of the P-type transistor is less affected by the interface resistance unlike the N-type transistor, while the poly depletion is less of an issue for the N-type transistor compared to the P-type transistor. In other words, in the overall performance of semiconductor devices, in the case of the P-type transistor, the poly depletion is a more important factor than the interface resistance, while in the case of the N-type transistor, the interface resistance is a more important factor than the poly-depletion problem.

In view of the above, embodiments of the invention improve the device performance by separately dealing with the above-described issues, i.e., the high interface resistance problem in the N-type transistor and the poly depletion problem leading to unacceptable C-V characteristics in the P-type transistor.

FIG. 1 is a cross-sectional view showing a semiconductor device having stack gate, e.g. transistor, structures 100, 101 according to one embodiment of the present invention. In particular, a P-type (PMOS) transistor 101 and an N-type (NMOS) transistor 100 are formed on a semiconductor substrate 105 having an NMOS region and a PMOS region. The N-type transistor 100 is formed in the NMOS region. The P-type transistor 101 is formed in the PMOS region.

The N-type transistor 100 includes a gate dielectric layer 110 and a gate stack 130N, which are sequentially formed on a channel region disposed between impurity regions, e.g., source/drain regions 160 in the NMOS region. The gate stack 130N further comprises a n-type silicon layer 120N doped with n-type impurities such as phosphorus (P), arsenic (As), or antimony (Sb); an ohmic layer 132 such as a metal silicide layer; a reaction barrier layer 134 such as a metal nitride layer; and a metal layer 136, all of which are sequentially stacked.

On the other hand, the P-type transistor 101 includes another gate dielectric layer 110 and another gate stack 130P, which are sequentially formed on another channel region between other impurity regions 160 in the PMOS region. The gate stack 130P further includes a p-type silicon layer 120P doped with p-type impurities such as boron; another reaction barrier layer 134; and another metal layer 136, all of which are sequentially stacked.

The metal layer 136 may be formed of a metal having a low sheet resistance such as W, Ta, Re, Os, Mo, Nb, V, Hf, Zr and Ti. A conventional hard mask layer 140 formed of a material such as silicon nitride may be formed on each gate stack 100, 101 and insulating spacers 150 are formed along sidewalls of each gate stack 100, 101 as known to one skilled in the art.

According to some embodiments of the present invention, the reaction barrier layer 134 may be a metal nitride such as WN, TiN or TaN. As discussed above, the reaction barrier layer 134 is formed between the metal layer 136 and the doped silicon layer 120N or 120P to prevent or reduce any reaction therebetween, e.g., the reactive formation of a silicide material such as tungsten silicide, by suppressing the mutual inter-diffusion of metal and silicon. Such a silicide material typically has a resistance value that is higher than that of metal, thereby undesirably increasing the resistance in the gate electrode.

In important contrast with the gate stack 130N, in the gate stack 130P there is no ohmic layer such as ohmic layer 132 disposed between the doped silicon layer 120P and the reaction barrier 134 in the gate stack 130P. Thus, in the gate stack 130P, the reaction barrier layer 134 directly contacts the doped silicon layer 120P without an ohmic layer such as ohmic layer 132 being disposed therebetween.

The ohmic layer 132 of the gate stack 130N decreases the contact, or interface, resistance between the doped silicon layer 120N and the reaction barrier layer 134. Because the interface resistance between the doped silicon layer 120N and the reaction barrier layer 134 such as WN or TiN is high, in the gate stack 130N, the ohmic layer 132 is selectively formed therebetween to reduce the interface resistance. The ohmic layer 132 can be a refractory metal silicide such as $WSi_x$, $TiSi_x$, $CoSi_x$ and so on. Preferably, the refractory metal silicide comprises W and Si. The thickness of the ohmic layer 132 can be about 30 to about 200 angstroms, more preferably about 80 angstroms. If the metal layer 136 is formed of a particular metal, e.g., tungsten, the ohmic layer may be formed of a silicide of that particular metal, e.g., tungsten silicide.

However, as described above, if the ohmic layer 132 of a metal silicide is formed in the gate stack 120P of P-type transistor 101, it might act as a diffusion path for dopants such as boron (B). In particular, the dopants from the doped silicon layer 120P can rapidly diffuse or be absorbed into the metal silicide, for example, through the grain boundaries of the metal silicide. This would reduce the dopant concentration in the doped silicon layer 120P and would change the threshold voltage of the transistor, e.g., a CMOS transistor ("poly depletion"), thereby lowering the inversion capacitance of the device and producing unacceptable C-V characteristics.

In view of the above, according to an aspect of the present invention, the semiconductor device of the present invention selectively and intentionally does not include the ohmic layer 132 between the reaction barrier layer 134 and the doped silicon layer 120P in the gate stack 130P, thereby substantially reducing the diffusion paths for the dopants. In other words, differential intermediate layers characterize the two different stack gate structures, in accordance with the invention. This important difference will be briefly summarized below.

In accordance with convention, the main structural difference between the P-type and N-type stack gate (e.g. transistor) structures is the underlying P-type or N-type dopant.

In accordance with the invention, an additional structural difference includes differential intermediate layers within the stack gate (e.g. transistor) structures involving inclusion or exclusion of an ohmic contact layer between a semiconductor layer such as a silicon layer and the reaction barrier layer. These differences in intermediate layer structure emphasize the greater importance in N-type stack gate structures of interface resistance than poly depletion problems, and these differences in intermediate layer structure emphasize the greater importance in P-type stack gate structures of poly depletion than interface resistance problems.

As a result, semiconductor devices according to embodiments of the present invention can increase the inversion capacitance value of a P-type transistor 101 (FIG. 11) while improving the interface resistance characteristics of a N-type transistor 100 by selectively including the ohmic layer 132 only between the n-type silicon layer 120N and the reaction barrier layer 134 in the N-type gate electrode 130N of the N-type transistor 100 while omitting such an ohmic layer 132 in the P-type gate electrode 130P of the P-type transistor 101.

FIGS. 2 through 6 illustrate sequential processing steps for fabricating a semiconductor device having a dual gate structure of a p-type gate stack and n-type gate stack with differential intermediate layers according to one embodiment of the present invention. The elements having the same functions as those shown in FIG. 1 are denoted by the same or similar reference numerals, and a detailed description thereof is omitted.

Figure 2:
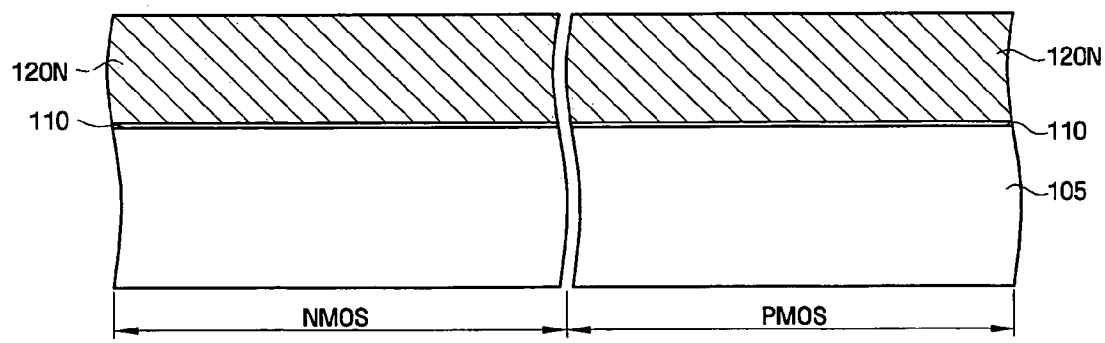
FIGS. 2 to 6 show consecutive steps for fabricating the gate structure in the semiconductor device of the embodiment shown in FIG. 1.

Referring to FIG. 2, a device isolation layer (not shown) is formed on a semiconductor substrate 105 to define active regions. The substrate 105 has an NMOS region typically for a cell region and a PMOS region typically for a peri/core region. The substrate 105 can be formed of a material such as Si, Ge, SiGe, GaP, GaAs, SiC, SiGeC, InAs, InPA or combinations thereof. Alternatively, the substrate 105 may be a silicon-on-insulator (SOI) substrate.

Then, a gate insulating layer 110 is formed on the semiconductor substrate 105. The gate insulating layer 110 can be formed of any suitable gate dielectric material including a high-k dielectric material such as $HfO_2$. Thereafter, an n-type polysilicon layer 120N doped with n-type impurities such as phosphorus or arsenic is formed on the gate dielectric layer 110. As is known, the n-type polysilicon layer 120N is formed by ion implanting known n-type impurities after forming a polysilicon layer or in situ doping of n-type impurities during the formation of the polysilicon layer. Alternatively, a plasma doping process can be used. The n-type polysilicon layer 120N may include only n-type impurities. Alternatively, the n-type polysilicon layer 120N may have n-type impurities in a concentration greater than that of p-type impurities.

Figure 3:
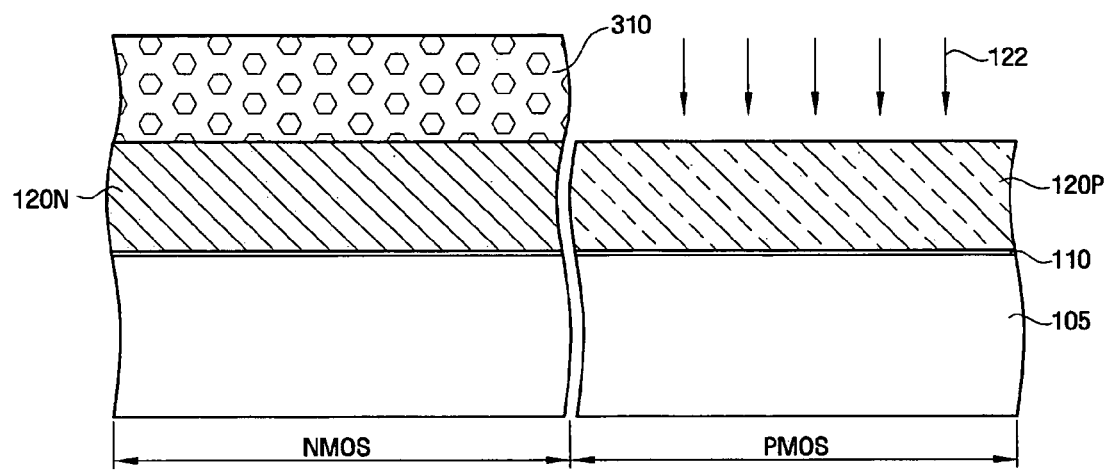

Referring to FIG. 3, a photoresist pattern 310 is formed on the substrate 105 to cover the NMOS region using conventional photolithography techniques. Next, p-type polysilicon layer 120P is formed at the PMOS region by performing a P-counter implantation process indicated by arrows 122, i.e., ion implanting p-type impurities into the n-type polysilicon layer 120N using the photoresist pattern 310 as a mask. The P-counter implanting process 122 uses p-type impurities such as B, $BF_2$, $BF_3$ or In at an energy of greater than 3 KeV and a concentration of about $1.0 \times 10^{15} \sim 10^{17}/cm^2$ such that the overall conductivity type of the ion-implanted layer is p-type, i.e., the concentration of p-type impurities exceeds that of n-type impurities, thereby forming a p-type silicon layer 120P at the PMOS region. Alternatively, the p-type polysilicon layer 120P may include only n-type impurities.

As a result, the n-type silicon layer and p-type silicon layer, i.e., a dual-polysilicon layer, are formed on the substrate 105 as shown. Then, to activate the n-type or p-type impurities, heat treatment such as rapid thermal processing (RTP) or conventional annealing processes are performed at, for example, temperature ranges of greater than about 600° C.

Alternatively, the dual-polysilicon layer may be formed by initially forming a p-type silicon layer 120P and subsequently ion-implanting n-type impurities in the NMOS region, opposite to the above processing sequence. Also, n-type or p-type impurities can be ion implanted using two different masks that respectively expose the NMOS region and PMOS region to form the dual-polysilicon layer. However, with the processing steps described above, i.e., by using a single ion implantation mask, the costs can be reduced and the manufacturing process can be simplified. In either case, the mask is removed, e.g. by any suitable method including conventional methods, after implantation. Thus, as is known to one skilled in the art, a rapid nitridation or cleaning process can also be performed to complete the implantation process steps.

Figure 4:
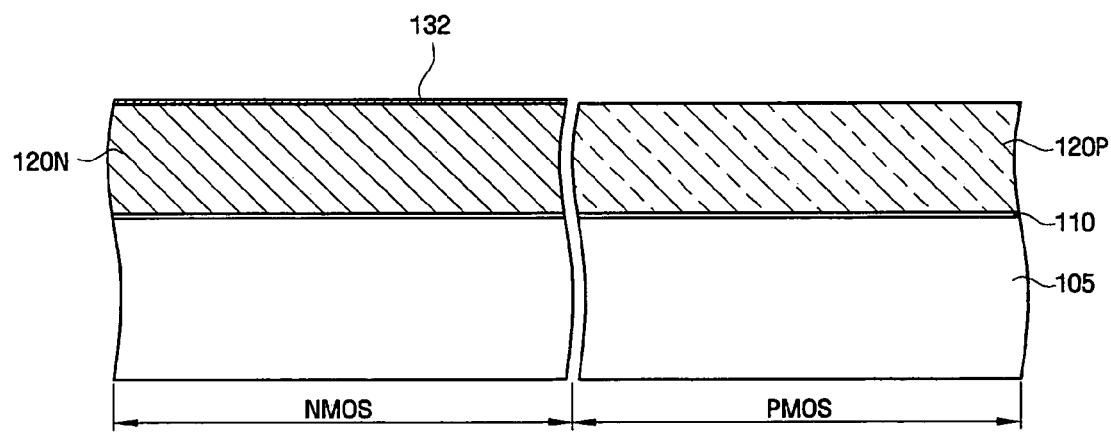

Referring to FIG. 4, an ohmic layer 132 is formed on the N-type silicon layer 120N. The ohmic layer 132 is selectively formed on the n-type silicon layer 120N by employing a selective chemical vapor deposition (CVD) process using, for example, $WF_6$ and $SiH_2Cl_2$ instead of $SiH_4$. Preferably, a gas flow ratio of $WF_6$ to $SiH_2Cl_2$ is about 1:25~160. In the selective CVD process, Ar can be used as a carrier gas at a partial pressure of greater than about 200 mTorr. During the process, the wafer can be heated at a temperature range of greater than about 450° C. In this case, the ohmic layer 132 does not form—or is negligibly formed—on the p-type silicon layer 120P. The ohmic layer can comprise a metal silicide such as $WSi_x$, $TiSi_x$, $TaSi_x$, $CoSi_x$ and $MoSi_x$. The thickness of the ohmic layer 132 can be about 30 to about 200 angstroms.

Alternatively, the ohmic layer 132 can be formed by initially forming an ohmic layer on both the n-type and p-type silicon layers 120P, 120N and then by removing the ohmic layer over the p-type silicon layer 120P using, for example, an etching process. In this case, the ohmic layer can be formed by conventional chemical vapor deposition (CVD) or physical vapor deposition (PVD) methods with subsequent heat treatment.

With the above described selective deposition process, the ohmic layer 132 can be, however, selectively formed on the NMOS region without using such an etching process, thereby saving manufacturing costs and simplifying the fabrication processing steps.

Figure 5:
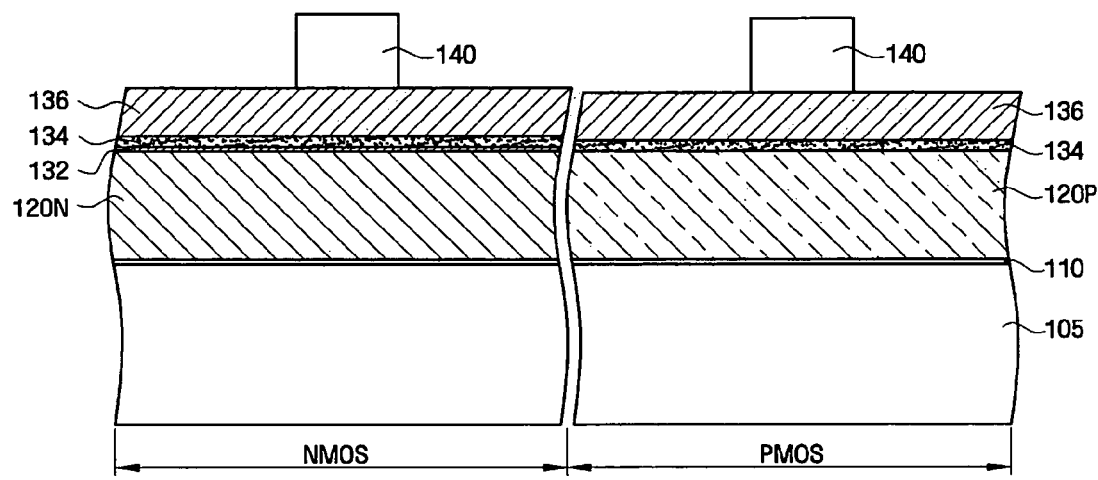

Referring to FIG. 5, a reaction barrier layer 134 having a thickness of about 50 to about 100 angstroms is formed on the ohmic layer 132 in the NMOS region and, preferably directly, on the reaction barrier layer 134 in the PMOS region using conventional techniques such as CVD, PVD or atomic layer deposition (ALD). Subsequently, a metal layer 136 formed of a metal such as refractory metal is formed on the reaction barrier layer 134. The metal layer 136 is formed to a thickness of from about 300 angstroms to about 600 angstroms. The barrier layer 132 can comprise at least one of WN, TiN, and TaN. The metal layer 136 can comprise at least one of W, Ta, Re, Os, Mo, Nb, V, Hf, Zr and Ti.

Then, a hard mask pattern 140 is formed on the refractory metal layer 136 to define gate electrodes. The hard mask pattern 140 may be formed of plasma-enhanced silicon nitride (PE-SiN) or low pressure silicon nitride (LP-SiN).

Figure 6:
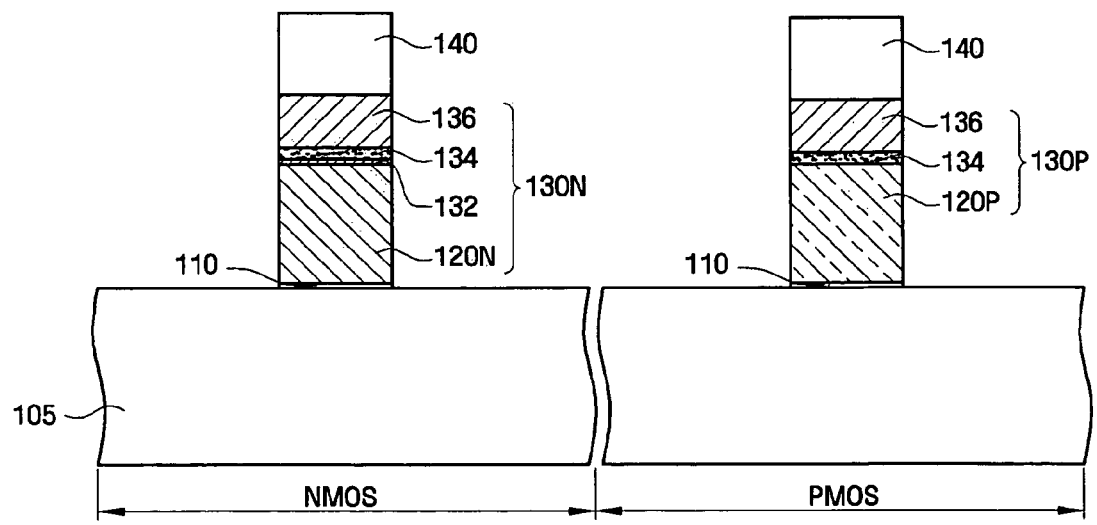

Referring to FIG. 6, the metal layer 136, the reaction barrier layer 134, the ohmic layer 132, the n-type and p-type silicon layers 130N, 130P and the gate insulating layer 110 are sequentially patterned, using the hard mask pattern 140, to form a gate structure in the respective NMOS and PMOS regions. Next, an ion implantation process is performed to form impurity regions 160 (refer to FIG. 1), e.g., LDD regions, in NMOS and PMOS regions, respectively. Next, sidewall spacers 150 shown in FIG. 1 may be formed on sidewalls of the gate structures formed on the NMOS and PMOS regions to form high concentration impurity regions (not shown), respectively (as a source/drain region).

As a result, stack gates, i.e., an N-type gate electrode 130N and a P-type gate electrode 130P are formed on the substrate 105. The N-type gate electrode 130N and P-type gate electrode 130P are similar in lay-up but are different: while the N-type gate electrode 130N includes an ohmic layer, the P-type gate electrode 130P does not. As discussed above, it has been determined that the interface resistance is less of an issue in the case of P-type transistor and that poly-depletion is less of an issue in the N-type transistor in the overall performance of semiconductor devices. Thus the invention yields the best of both worlds in a gate electrode pair of a CMOS transistor: an N-type gate electrode of low resistivity and a P-type electrode of much improved or reduced poly depletion than is conventional. Furthermore, the potential negative effects resulting from the differential intermediate stack gate structure, e.g., poly depletion in the n-type transistor or the interface resistance in the p-type transistor, have been determined to be acceptable for the device performance as shown below.

In brief summary, one of the two stacked gate structures includes an ohmic layer disposed between a semiconductor layer such as a polysilicon layer and a reaction barrier layer and the other does not. Otherwise stated, only one of the two stacked gate structures includes an ohmic layer between the semiconductor layer and the reaction barrier layer. As will be seen from FIG. 11 discussed below, the performance improvement of the invented differentially stacked gate structure pair over the prior art stacked gate structures is remarkable.

Subsequently, additional fabrication steps such as metallization or packaging steps are performed to complete semiconductor devices. However, these details well known to one skilled in the art are omitted herein for simplicity.

FIGS. 7 through 10 illustrate sequential processing steps for fabricating a semiconductor device having a dual gate structure of a p-type gate stack and n-type gate stack with differential intermediate layers according to the same embodiment of the present invention but using alternative process steps. The elements having the same functions as those shown in FIGS. 2 through 6 are denoted by the same or similar reference numerals, and a detailed description thereof is omitted.

Those of skill in the art will appreciate that the process illustrated in FIGS. 2-6 described above may be seen to involve a selective additive (i.e. deposition) process by which an ohmic layer 132 only selectively is added to a silicon layer, i.e. only in a region of the substrate corresponding to an N-type stack gate structure.

Those of skill in the art also will appreciate that the process illustrated in FIGS. 7-10 described below may be seen to involve a general additive process by which an ohmic layer 132 is added (i.e. deposited) generally to a silicon layer and then is selectively subtracted (i.e. removed as by etching) therefrom, i.e. only in a region of the substrate corresponding to a P-type stack gate structure.

The result of selective addition of an ohmic layer or overall addition followed by selective subtraction will be understood to produce the same resulting structure and performance improvements as described, illustrated and claimed herein. This is because selective subtraction of the part of the ohmic layer that is in the P-type stack gate structure leaves the ohmic layer intact in the N-type stack gate structure.

Figure 7:
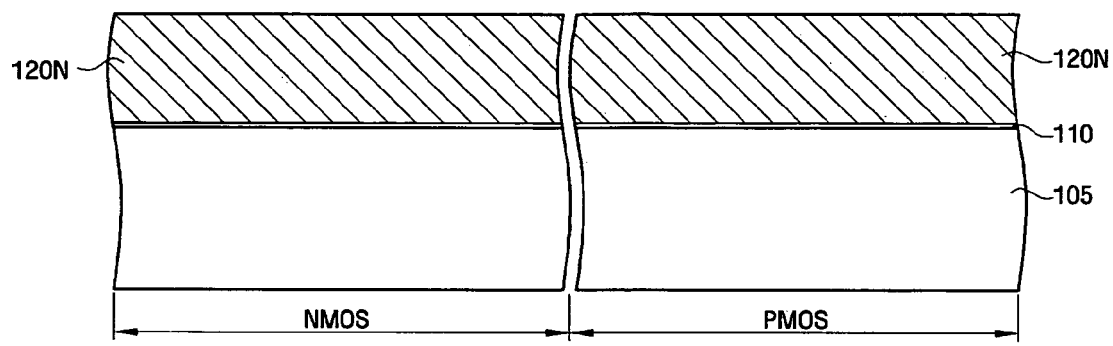
FIGS. 7-10 show consecutive fabrication steps for alternatively fabricating the gate structure in the semiconductor device of the embodiment shown in FIG. 1.

Referring to FIG. 7, a device isolation layer (not shown) is formed on a semiconductor substrate 105 having an NMOS region typically for a cell region and a PMOS region typically for a peri/core region as in the above described embodiment.

Then, a gate insulating layer 110 is formed on the semiconductor substrate 105. Thereafter, an n-type polysilicon layer 120N doped with n-type impurities such as phosphorus or arsenic is formed on the gate dielectric layer 110 using the methods described in the above embodiment.

Figure 8:
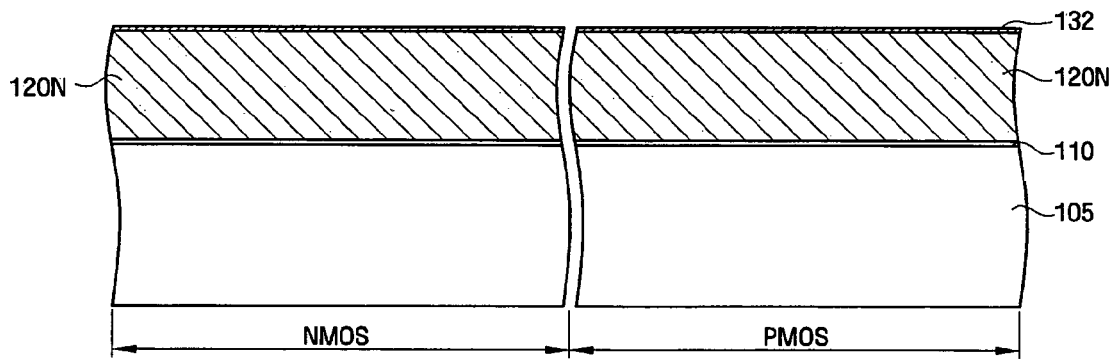

Referring to FIG. 8, an ohmic layer 132 is formed on substantially the entire surface of the n-type silicon layer 120N. The ohmic layer 132 can be formed using CVD or PVD methods, followed by subsequent heat treatment as known.

Figure 9:
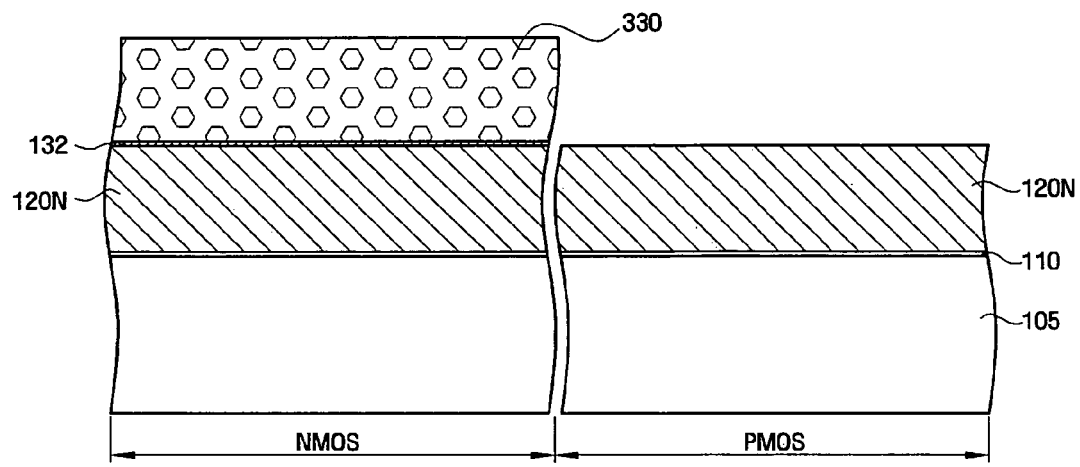

Referring to FIG. 9, the photoresist pattern 330 is formed to cover the NMOS region. A portion of the ohmic layer 132 in the PMOS region is removed by, for example, using a dry or wet etch process with the photoresist pattern 330 as an etch mask. As a result, the n-type silicon layer in the PMOS region is exposed.

Figure 10:
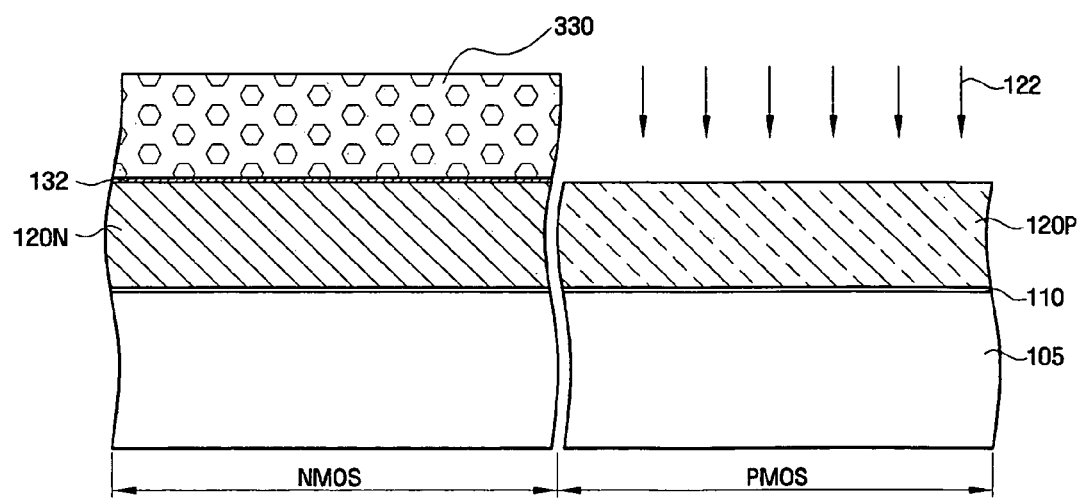

Referring to FIG. 10, the P-type polysilicon layer 120P doped with p-type impurities is formed in the PMOS region by performing a P-counter implantation process 122 described above into the exposed n-type silicon layer 120N using the photoresist pattern 330 as a mask. The overall conductivity of the ion-implanted silicon layer is preferably a p-type, i.e., the concentration of the p-type impurities being greater than that of the n-type impurities present. As a result, a dual-polysilicon layer having the n-type silicon layer 120N in the NMOS region and the p-type silicon layer 120P in the PMOS region is formed. Subsequently, the rapid nitridation and the cleaning process (which includes removal of photoresist pattern 330) can be performed on the resulting structure.

With the processing steps described above, i.e., by using a single ion implantation mask, the costs can be reduced and the manufacturing process can be simplified because two different masks that respectively expose the NMOS region and PMOS region to form the dual-polysilicon layer need not be used in the present embodiment.

The rest of the processing steps to form the N-type transistor 100 and the P-type transistor 101 are the same as described in the above embodiment.

Figure 11:
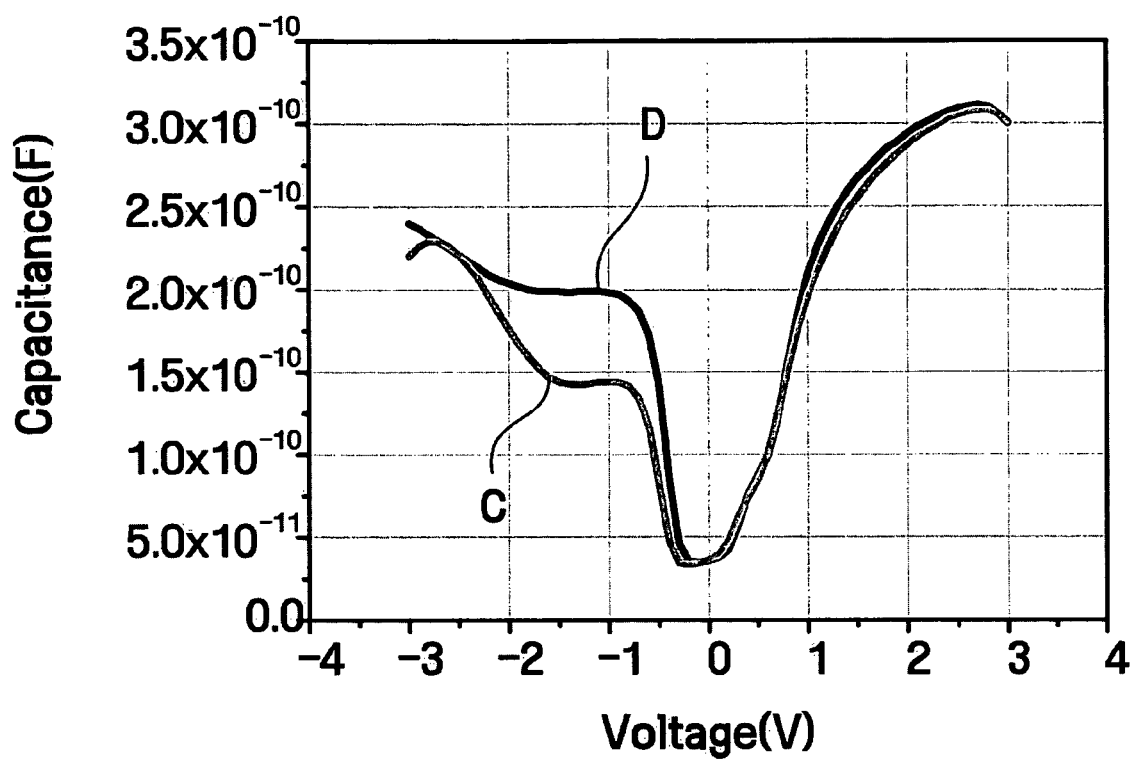
FIG. 11 is a graph illustrating the capacitance-voltage (C-V) curves of a PMOS W poly-metal gate electrode with and without an ohmic layer.

FIG. 11 is a graph illustrating C-V curves of PMOS W poly-metal gate electrode with and without an ohmic layer.

Referring to FIG. 11, the curved line D illustrates experimental test results of the invention (without an ohmic layer), and contrasts such results with that of curved line C representing prior art results (with an ohmic layer). The experimental stack gate electrodes both utilize W poly-metal in the gate electrode and $WSi_x$ in the selectively included ohmic layer. Those of skill in the art will appreciate that the vertical axis represents the measured capacitance across the gate electrode junction in Farads while the horizontal axis represents the applied gate electrode voltage across the gate electrode in volts. As shown in FIG. 11, the capacitance of curve D is $2.0*10^{-10}$ F and the capacitance value of C is $1.5*10^{-10}$ F at a voltage, e.g. $-1.5$ V, of particular importance. Therefore, by using the gate electrode structure without the ohmic layer, gate depletion can be decreased (improved) by about 33% at $-1.5$ V, which results in a significant and very desirable increase of the overall inversion capacitance value.

Table I below illustrates experimental yield data for three distinct cases:

1) where a non-selective (general) ohmic layer is employed;

2) where a selective ohmic layer extending only within the NMOS stack gate structure is employed; and 3) where no ohmic layer, whether selective or general, is employed.

TABLE I

|  | Ohmic layer employed | | NMOS only ohmic layer employed | | Ohmic layer skipped | |
| --- | --- | --- | --- | --- | --- | --- |
|  | NMOS | PMOS | NMOS | PMOS | NMOS | PMOS |
| Inclusion of ohmic layer | yes | yes | yes | no | no | no |
| Yield(%)[1] | 32% | | 35~36.5% | | 0% | |

[1]Yields are tabulated as percentages of functional semiconductor dies relative to total number of dies tested at the wafer level.
[2]The empirical results of the three distinct cases were obtained using multiple wafers to provide a statistically significant number of samples.

Therefore, higher speed and lower power devices can be realized due to the unique semiconductor stacked gate layer structure disclosed and illustrated herein in various embodiments. The unique selective inclusion in the semiconductor stacked gate layer structure of an ohmic layer, and in such selective inclusion of the ohmic layer only in the N-type stacked gate layer region of the structure, can reduce poly depletion problem in the P-type transistor while drastically reducing the interface resistance in the N-type transistor. Also, with some embodiments of the present invention, the processing steps can be simplified by either not using a mask but instead generally, non-selectively forming an ohmic layer in both the NMOS region and the PMOS region and then using a mask to selectively remove the ohmic layer in the PMOS region only (the subtractive process described herein in connection with FIGS. 7-10) or by using a single mask to selectively form the ohmic layer in the NMOS region only (the additive process described herein in connection with FIGS. 2-6). Further, according to some embodiments, the present invention can be used to fabricate volatile memories such as dynamic random access memories (DRAMs) or to fabricate non-volatile memories such as flash memories.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Various operations will be described as multiple discrete steps performed in a manner that is most helpful in understanding the invention. However, the order in which the steps are described does not imply that the operations are order-dependent or that the order that steps are performed must be the order in which the steps are presented.

Having described and illustrated the principles of the invention in several preferred embodiments, it should be apparent that the embodiments may be modified in arrangement and detail without departing from such principles. We claim all modifications and variation coming within the spirit and scope of the following claims.

The invention claimed is:

1. A semiconductor device comprising:
   a semiconductor substrate;
   at least two stacked gate structures formed on the substrate, the two stacked gate structures each including:
   a gate insulating layer on the substrate;
   a semiconductor layer on the gate insulating layer;
   a reaction barrier layer on the semiconductor layer; and
   a metal layer on the barrier layer,
   wherein one of the two stacked gate structures further includes an ohmic layer disposed between the semiconductor layer and the reaction barrier layer, and wherein the other of the two stacked gate structures does not include an ohmic layer therebetween, and
   wherein the reaction barrier layer physically contacts the semiconductor layer in the other of the two stacked gate structures from a first edge of the other of the two stacked gate structures to a second edge of the other of the two stacked gate structures, wherein the second edge is opposite the first edge.

2. The semiconductor device of claim 1, wherein the reaction barrier layer is directly formed on the semiconductor layer in the other of the two stacked gate structures.

3. The semiconductor device of claim 1, wherein the one of the two stacked gate structures forms a portion of an N-type transistor, and wherein the other of the two stacked gate structures forms a portion of a P-type transistor.

4. The semiconductor device of claim 1, wherein the semiconductor layer comprises silicon.

5. The semiconductor device of claim 1, wherein the ohmic layer comprises a metal silicide.

6. The semiconductor device of claim 1, wherein the reaction barrier layer comprises WN, TiN, or TaN.

7. The semiconductor device of claim 1, wherein the thickness of the ohmic layer is about 30 to about 200 angstroms.

8. The semiconductor device of claim 1, wherein the reaction barrier layer has a thickness of about 50 to about 100 angstroms.

9. A semiconductor device comprising:
   at least two stacked gate structures formed on a substrate, the two stacked gate structures each including a semiconductor layer and a metal layer over the semiconductor layer,
   wherein the two stacked gate structures on the substrate are characterized by differential intermediate layers, one of the two structures including an ohmic layer and the other of the two structures not including an ohmic layer, and
   wherein each of the stacked gate structures includes a reaction barrier layer, and wherein the reaction barrier layer physically contacts the semiconductor layer in the other of the two stacked gate structures from a first edge of the other of the two stacked gate structures to a second edge of the other of the two stacked gate structures, wherein the second edge is opposite the first edge.

10. The semiconductor device of claim 9, wherein the semiconductor layer comprises a silicon layer, and wherein the one of the two gate structures interposes the ohmic layer between the silicon layer and the reaction barrier layer.

11. The semiconductor device of claim 9, wherein the one of the two gate structures forms a portion of an N-type transistor.

12. The semiconductor device of claim 9, wherein the other of the two gate structures forms a portion of a P-type transistor.

13. The semiconductor device of claim 9, wherein the one of the two gate structures forms a portion of an N-type transistor, and wherein the other of the two gate structures forms a portion of a P-type transistor.

14. The semiconductor device of claim 13, wherein the structure not including an ohmic layer is associated with the P-type transistor.

15. The semiconductor device of claim 1, wherein the two stacked gate structures are spaced apart from each other.

16. The semiconductor device of claim 9, wherein an upper surface of the semiconductor layer of the other of the two stacked gate structures physically contacts a single layer.

17. The semiconductor device of claim 9, wherein the two stacked gate structures are spaced apart from each other.

* * * * *